(12) United States Patent
Tian et al.

(10) Patent No.: US 12,433,135 B2
(45) Date of Patent: Sep. 30, 2025

(54) DISPLAY MODULE AND DISPLAY DEVICE

(71) Applicant: KunShan Go-Visionox Opto-Electronics Co., Ltd, Jiangsu (CN)

(72) Inventors: Yuchen Tian, Kunshan (CN); Zongwei Luo, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 684 days.

(21) Appl. No.: 17/834,145

(22) Filed: Jun. 7, 2022

(65) Prior Publication Data

US 2022/0302422 A1 Sep. 22, 2022

Related U.S. Application Data

(63) Continuation of application No. PCT/CN2021/090864, filed on Apr. 29, 2021.

(30) Foreign Application Priority Data

Jun. 28, 2020 (CN) .......................... 202010601718.1

(51) Int. Cl.
*H10K 59/80* (2023.01)
*H10K 59/40* (2023.01)
*H10K 59/65* (2023.01)

(52) U.S. Cl.
CPC ......... *H10K 59/8722* (2023.02); *H10K 59/40* (2023.02); *H10K 59/65* (2023.02); *H10K 59/8792* (2023.02)

(58) Field of Classification Search
CPC .. H10K 59/8722; H10K 50/865; H10K 59/40; H10K 59/65; H10K 59/8792
See application file for complete search history.

(56) References Cited

U.S. PATENT DOCUMENTS

2001/0048494 A1 12/2001 Koma
2020/0273934 A1* 8/2020 You .................... H10K 59/8792
2020/0411608 A1* 12/2020 Tang .................... G06F 3/0446

FOREIGN PATENT DOCUMENTS

CN 107193412 A 9/2017
CN 107807468 A * 3/2018
(Continued)

OTHER PUBLICATIONS

International Search Report mailed Aug. 2, 2021, in corresponding International Application No. PCT/CN2021/090864, 4 pages (with English Translation).
(Continued)

*Primary Examiner* — Syed I Gheyas
(74) *Attorney, Agent, or Firm* — Maier & Maier, PLLC

(57) ABSTRACT

A display module includes a functional layer and a display panel. The display module is provided with a hole region, a display region and a non-display region between the hole region and the display region. A through hole is provided at a portion of the functional layer and the display panel corresponding to the hole region. The display module includes a light shielding layer and a non-display portion located in the non-display region. In a thickness direction of the display module, the sum of the thickness of the non-display portion and the thickness of the light shielding layer is the same as the sum of the thickness of the functional layer in the display region and the thickness of the display panel in the display region.

20 Claims, 6 Drawing Sheets

(56) References Cited

FOREIGN PATENT DOCUMENTS

| CN | 207689793 U | | 8/2018 | | |
|---|---|---|---|---|---|
| CN | 108681131 A | * | 10/2018 | ........... | G02F 1/1333 |
| CN | 108983468 A | | 12/2018 | | |
| CN | 109031756 A | | 12/2018 | | |
| CN | 109100892 A | | 12/2018 | | |
| CN | 109116628 A | | 1/2019 | | |
| CN | 109324440 A | | 2/2019 | | |
| CN | 109541833 A | | 3/2019 | | |
| CN | 109637364 A | | 4/2019 | | |
| CN | 109887410 A | | 6/2019 | | |
| CN | 110007527 A | | 7/2019 | | |
| CN | 110062082 A | | 7/2019 | | |
| CN | 110796954 A | | 2/2020 | | |
| CN | 210324946 U | | 4/2020 | | |
| CN | 111142713 A | | 5/2020 | | |
| CN | 111754877 A | | 10/2020 | | |
| KR | 10-2020-0023763 A | | 3/2020 | | |

OTHER PUBLICATIONS

The First Office Action issued Sep. 2, 2021, corresponding to Chinese Application No. 202010601718.1; 20 pages, (with machine-generated English Translation).
Second Office Action issued Jan. 13, 2022, corresponding to Chinese Application No. 202010601718.1, 20 pages (with machine-generated English Translation).
Notification of Rejection issued Apr. 14, 2022, corresponding to Chinese Application No. 202010601718.1, 15 pages (with machine-generated English Translation).

\* cited by examiner

DISPLAY MODULE AND DISPLAY DEVICE

CROSS-REFERENCE TO RELATED APPLICATION

This is a continuation of International Patent Application No. PCT/CN2021/090864, filed Apr. 29, 2021, which claims priority to Chinese Patent Application No. 202010601718.1 filed with the China National Intellectual Property Administration (CNIPA) on Jun. 28, 2020, the disclosure of which is incorporated herein by reference in its entirety.

TECHNICAL FIELD

The present disclosure relates to the field of display technologies, for example, to a display module and a display device.

BACKGROUND

With the development of the display technologies, functions of display modules are becoming more and more diverse, and display modules with the optical information collection function (such as the camera function) are more and more widely applied.

However, in the process of collecting optical information (such as capturing images) by the display modules, the collected optical information is greatly disturbed (such as light leakage), thereby limiting the application of the display modules.

SUMMARY

The present disclosure provides a display module and a display device to reduce interference to the display module when the display module collects optical information.

The solutions provided by the present disclosure are as follows.

In a first aspect, an embodiment of the present disclosure provides a display module. The display module includes a functional layer and a display panel. The display module is provided with a hole region, a display region and a non-display region between the hole region and the display region. A through hole is disposed in the hole region. A light shielding layer and a non-display portion are disposed in at least one of a portion of the display module corresponding to the functional layer and located in the non-display region or a portion of the display module corresponding to the display panel and located in the non-display region. In a thickness direction of the display module, the sum of the thickness of the non-display portion and the thickness of the light shielding layer is the same as the sum of the thickness of the portion of the functional layer in the display region and the thickness of the portion of the display panel in the display region.

In a second aspect, an embodiment of the present disclosure provides a display device. The display device includes the display module described in the first aspect, and a camera module is disposed below the hole region.

In the embodiments of the present disclosure, the display module includes a functional layer and a display panel. The display module is provided with a hole region, a display region and a non-display region between the hole region and the display region. A through hole is provided at a portion in the functional layer and the display panel corresponding to the hole region. The display module includes light shielding layer and a non-display portion located in the non-display region. In the thickness direction of the display module, the sum of the thickness of the non-display portion and the thickness of the light shielding layer is the same as the sum of the thickness of the portion of the functional layer and the thickness of the portion of the display panel in the display region. The light shielding layer can play a role of shielding light, preventing the light emitted from the display panel from scattering from the display module corresponding to the hole region, that is, the light leakage phenomenon can be avoided. The light shielding layer do not cause a gap between film layers in the display module, that is, the functional layer and the display panel in the display region are closely attached to each other. In this manner, on the one hand, the overall thickness of the display module can be reduced, and on the other hand, water, oxygen and the like can be prevented from entering the functional layer and the display panel located in the display region. Thus, the risk of corrosion of the functional layer and the display panel is reduced, and the life of the display module is prolonged.

DETAILED DESCRIPTION

As mentioned in the background, the display module is susceptible to interference when collecting optical information. After careful research it is found that the display module generally includes a hole region and a display region, and an optical information collection unit (for example, a camera module) is disposed below the hole region. However, when the optical information collection unit collects optical information, light emitted from the display panel is reflected and refracted at the display panel and other functional layers adjacent to the hole region. The reflected and refracted light enters the hole region and then is scattered from the hole region to the outside of the display module. Therefore, a light leakage phenomenon occurs, thereby interfering with the optical information collection unit.

The solutions provided by the present disclosure are as follows.

Figure 1:
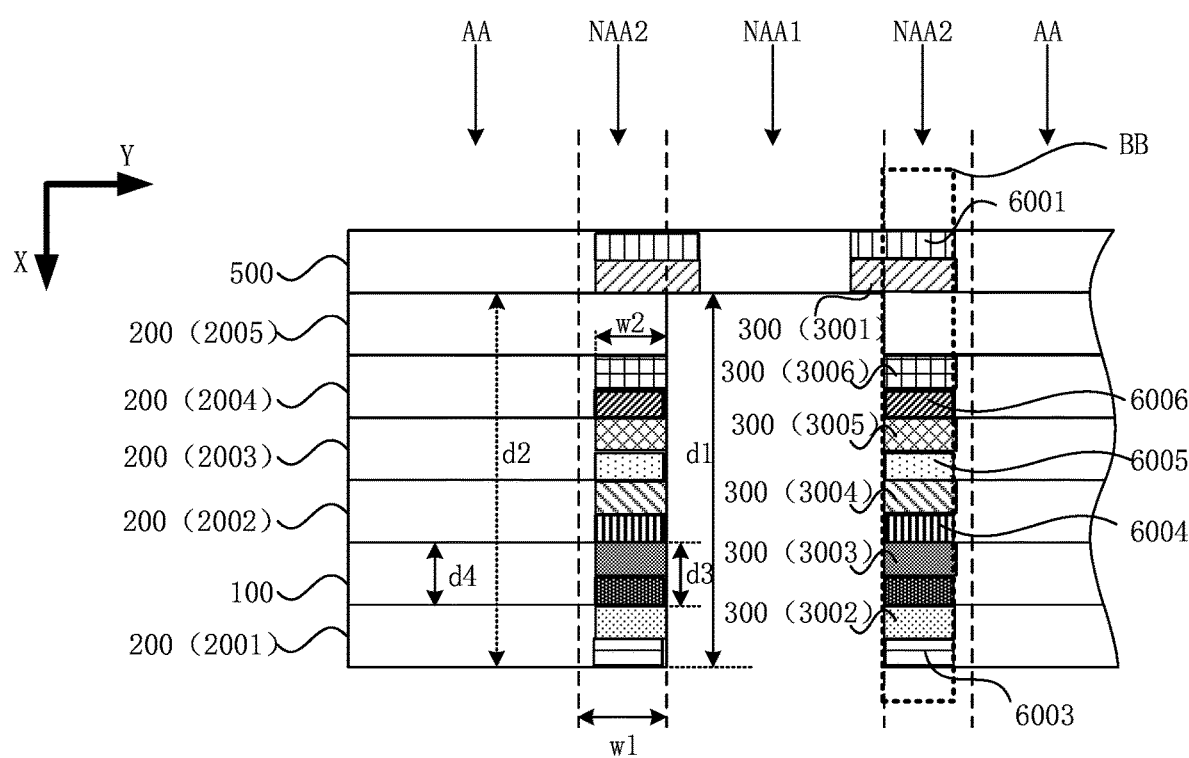
FIG. 1 is a diagram illustrating the structure of a display module according to an embodiment of the present disclosure.

Referring to FIG. 1, the display module includes a functional layer 200 and a display panel 100. Moreover, the display module is provided with a hole region NAA1, a display region AA and a non-display region NAA2 between the hole region NAA1 and the display region AA. A through hole is provided at a portion (that is, a portion of the display module in the hole region NAA1) in the functional layer 200 and the display panel 100 corresponding to the hole region NAA1. That is, a through hole is disposed in the hole region. The display module includes a light shielding layer 300 and a non-display portion located in the non-display region NAA2. In a thickness direction of the display module, the sum d1 of the thickness of the non-display portion and the thickness of the light shielding layer 300 is the same as the sum d2 of the thickness of the portion of the functional layer and the thickness of the portion of the display panel in the display region.

Exemplarily, referring to FIG. 1, the non-display portion is a portion in the area of the dotted box BB in FIG. 1 other than the light shielding layer 300. In a case where the display module includes a cover plate 500, the non-display portion includes a first thinned portion 6001, and in a case where the display module does not include the cover plate 500, the non-display portion does not include the first thinned portion 6001.

The functional layer may include, for example, a film layer configured to implement the touch function, or may include other film layers, such as an optical adhesive layer which fixes the touch film layer and the display panel. The functional layer is generally a film layer having a higher transmittance. The light emitted from a portion of the display panel adjacent to the non-display region NAA2 is reflected or refracted when passing through the interface between the functional layer or the display panel or other film layers. The reflected or refracted light enters the non-display region NAA2. The light shielding layer 300 disposed in the non-display region absorbs light, preventing the light from entering the hole region, thereby reducing interference to the optical information collection unit.

Figure 2:
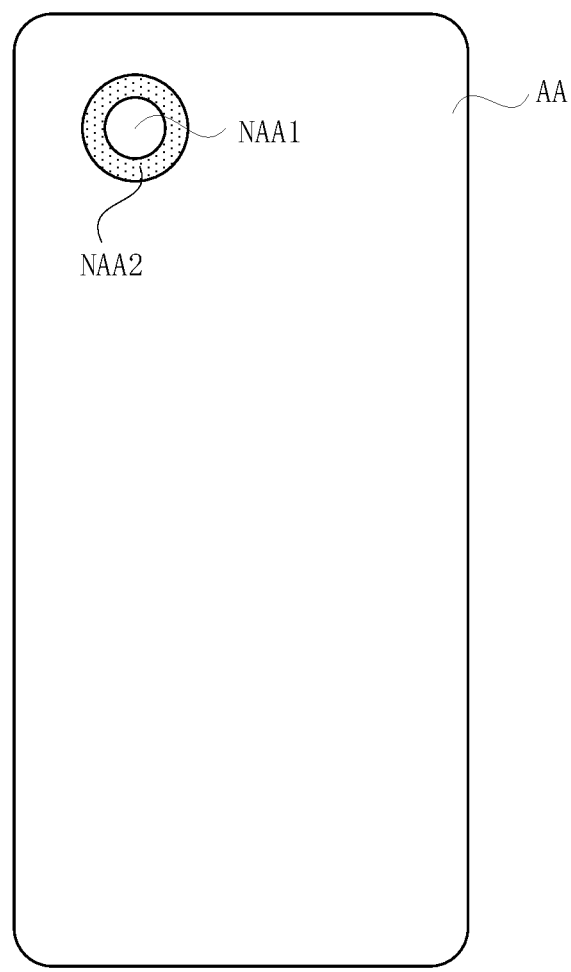
FIG. 2 is a top view of a display module according to an embodiment of the present disclosure.
Figure 3:
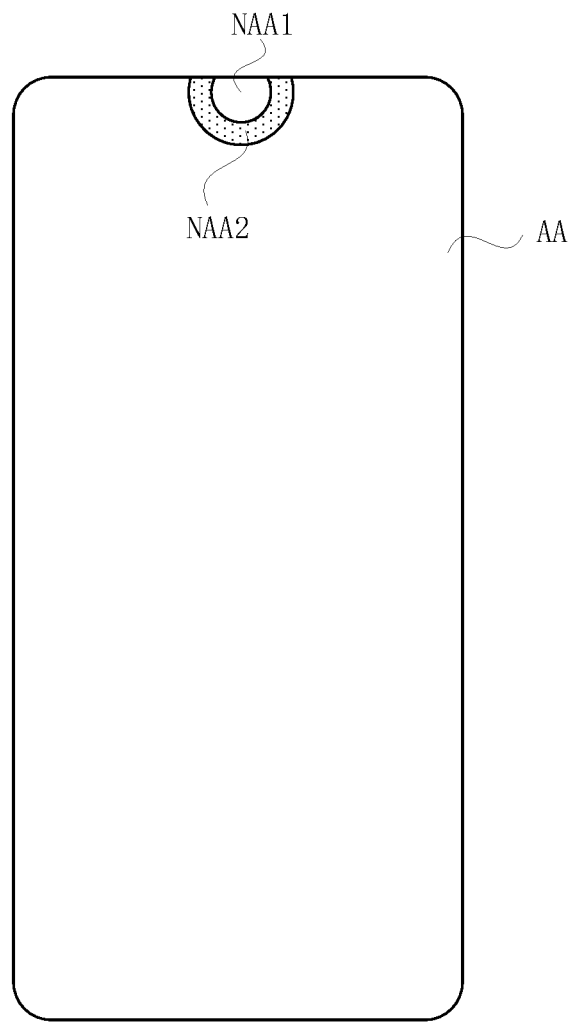
FIG. 3 is a top view of another display module according to an embodiment of the present disclosure.

Referring to FIG. 1, the light shielding layer 300 includes a first light shielding layer 3001 (the light shielding layer 300 includes the first light shielding layer 3001 only in a case where the display module includes the cover plate 500), a second light shielding layer 3003, a third light shielding layer 3002, a fourth light shielding layer 3004, a fifth light shielding layer 3005 and a sixth light shielding layer 3006. The display region AA of the display module corresponding to FIG. 2 completely surrounds the non-display region NAA2. The display region AA of the display module corresponding to FIG. 3 semi-surrounds the non-display region NAA2. The display module corresponding to FIG. 3 is also commonly referred to as "waterdrop screen". In the non-display region NAA2, an encapsulation layer is provided to block water and oxygen and protect a light-emitting layer located in the display region.

Figure 4:
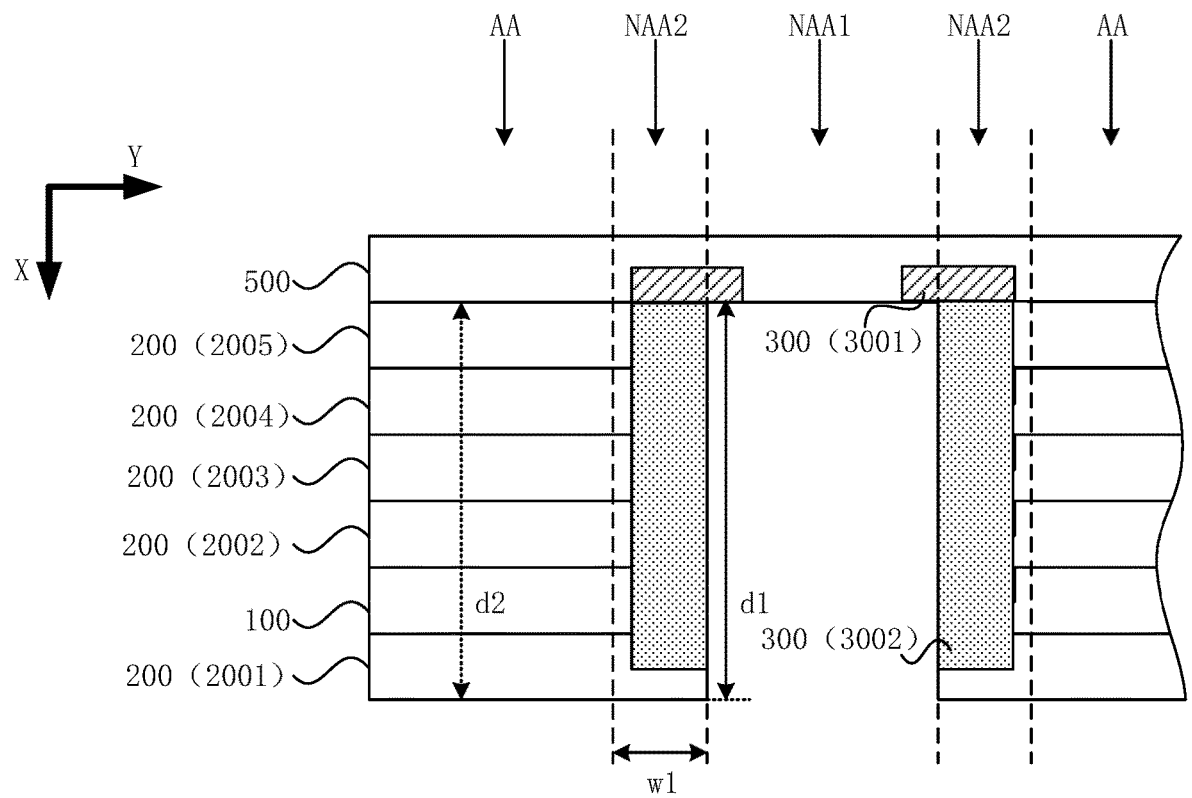
FIG. 4 is a diagram illustrating the structure of another display module according to an embodiment of the present disclosure.

In this embodiment, a light shielding layer 300 and a non-display portion is disposed in at least one of a portion of the display module corresponding to the functional layer and located in the non-display region or a portion of the display module corresponding to the display panel and located in the non-display region. For example, the portion of the display module corresponding to the functional layer and located in the non-display region and the portion of the display module corresponding to the display panel and located in the non-display region both include a non-display portion and a light shielding layer 300, that is, the structure shown in FIG. 1. Alternatively, referring to FIG. 4, the portion of the display module located in the non-display region and corresponding to the functional layer includes a non-display portion and a light shielding layer 300. Exemplarily, the functional layer 200 in the non-display region includes a support layer 2001 disposed on one side of the backlight surface of the display panel. The light shielding layer 300 includes a third light shielding layer 3002. The portion of the display module corresponding to the display panel and located in the non-display region does not include a non-display portion. The third light shielding layer 3002 is disposed in contact with the support layer 2001. The sum of the thickness of the third light shielding layer 3002 and the thickness of the support layer 2001 is the same as the sum of the thickness of the portion of the functional layer in the display region and the thickness of the portion of the display panel in the display region. The light shielding layer can play the role of shielding light to prevent the light emitted from the display panel from scattering from the portion of the display module corresponding to the hole region. That is, the light leakage phenomenon can be avoided, and the quality of the optical information collected by the optical information collection unit is improved. The sum d1 of the thickness of the non-display portion and the thickness of the light shielding layer is the same as the sum d2 of the thickness of the portion of the functional layer and the thickness of the portion of the display panel in the display region. In this manner, the light shielding layer does not cause a gap between film layers in the display module, that is, the functional layer and the display panel in the display region are closely attached to each other. On the one hand, the overall thickness of the display module can be reduced, and on the other hand, water, oxygen and the like can be prevented from entering the functional layer and the display panel in the display region. Thus, the risk of corrosion of the functional layer and the display panel is reduced, and the life of the display module is prolonged.

In this embodiment, the display module includes the functional layer and the display panel. The display module is provided with the hole region, the display region and the non-display region between the hole region and the display region. The through hole is provided at the portion in the functional layer and the display panel corresponding to the hole region. The at least one of the portion of the display module corresponding to the functional layer and located in the non-display region or the portion of the display module corresponding to the display panel and located in the non-display region includes the light shielding layer and the non-display portion.

In the thickness direction of the display module, the sum of the thickness of the non-display portion and the thickness of the shielding layer is the same as the sum of the thickness of the portion of the functional layer and the thickness of the portion of the display panel in the display region. The light shielding layer can play a role of shielding light, thereby preventing the light emitted by the display panel from being scattered from the portion of the display module corresponding to the hole region, that is, the light leakage phenomenon can be avoided. The light shielding layer does not cause a gap between film layers in the display module, that is, the functional layer and the display panel in the display region are closely attached to each other. In this manner, on the one hand, the overall thickness of the display module can be reduced, and on the other hand, water, oxygen and the like can be prevented from entering the functional layer and the display panel in the display region. Thus, the risk of corrosion of the functional layer or the display panel is reduced, and the life of the display module is prolonged.

Optionally, referring to FIG. 1, the non-display portion includes a thinned portion contacting with the light shielding layer 300. The thinned portion is disposed in at least one of a portion of the functional layer 200 or a portion of the display panel 100 located in the non-display region NAA2. In the thickness direction X of the display module, the sum d3 of the thickness of the thinned portion and the thickness of the light shielding layer 300 is correspondingly the same as the thickness d4 of the portion of functional layer in the display region AA or the thickness d4 of the portion of the display panel in the display region AA. Exemplarily, referring to FIG. 1 and FIG. 5, the thinned portion may be at least one of the first thinned portion 6001 (the thinned portion includes the first thinned portion only in the case where the display module includes the cover plate 500), a second thinned portion 6002, a third thinned portion 6003, a fourth thinned portion 6004, a fifth thinned portion 6005 or a sixth thinned portion 6006.

A thinned portion is disposed in at least one of a portion of the functional layer or a portion of the display panel located in the non-display region. For example, the thinned portion is disposed in the portion of the functional layer corresponding to the non-display region, and the light shielding layer is disposed at the thinned portion. The sum of the thickness of the thinned portion and the thickness of the light shielding layer is correspondingly the same as the thickness of the portion of the functional layer or the thickness of the portion of the display panel in the display region. That is, if the thinned portion and the light shielding layer are correspondingly disposed only in the portion of the functional layer in the non-display region, the sum of thickness of the thinned portion and the thickness of the light shielding layer is the same as the thickness of the portion of the functional layer in the display region. If the thinned portion and the light shielding layer are correspondingly disposed only in the portion of the display panel 100 in the non-display region, the sum d3 of the thickness of the thinned portion and the thickness of the light shielding layer is the same as the thickness d4 of the portion of the display panel in the display region. If the functional layer located in the non-display region and the display panel located in the non-display region are each provided with the thinned portion and the light shielding layer, the sum of the thicknesses of the light shielding layer and the thinned portion corresponding to the display panel in the non-display region is the same as the thickness of the portion of the display panel in the display region, and the sum of the thicknesses of the light shielding layer and the thinned portion corresponding to the functional layer in the non-display region is the same as the thickness of the portion of the functional layer in the display region.

Alternatively, referring to FIG. 1, at least one of t the functional layer or the portion of the display panel includes a light shielding layer located in the non-display region. In this embodiment, the light shielding layer is a portion of the corresponding display panel or functional layer. The light shielding layer may be formed by doping the portion of the functional layer located in the non-display region with light shielding particles. For example, when the functional layer is a film layer such as an optical adhesive layer, a support layer or a polarizing layer, the light shielding layer may be formed by mixing the light shielding particles so that the functional layer does not need to be thinned, and damage to the functional layer is reduced. Alternatively, the portion of the functional layer located in the non-display region is thinned, and the light shielding layer is disposed on the thinned portion. When the functional layer corresponding to the provided light shielding layer is a touch layer or the portion corresponding to the provided light shielding layer is a display panel, the light shielding layer may be formed via adding a process of etching the light shielding layer in the etching process flow.

Optionally, referring to FIG. 1, the display module further includes the cover plate 500. The cover plate 500 is located on the light-emitting side of the display module. The first thinned portion 6001 is disposed in a portion of the cover plate 500 located in the non-display region NAA2. Moreover, the display module further includes the first light shielding layer 3001 disposed in contact with the first thinned portion 6001. The first light shielding layer 3001 extends from the non-display region NAA2 to the hole region NAA1 and covers a portion of the hole region NAA1.

Exemplarily, the cover plate 500 may be, for example, a glass cover plate which plays a role of encapsulation or protection in the display module. Since the light-emitting surface of the cover plate 500 is the light-emitting surface of the display module, if there is light leakage at the cover plate 500, it inevitably causes the light leakage of the display module in the hole region. The first thinned portion 6001 may be disposed on the cover plate, and the first light shielding layer 3001 may be correspondingly disposed at the first thinned portion (6001) so that in the thickness direction of the display module, the sum of the thickness of the first thinned portion 6001 and the thickness of the first light shielding layer is the same as the thickness of the portion of the cover plate in the display region. Thus, the light leakage of the cover plate 500 in the hole region is avoided, and the risk of the light leakage of the display module is reduced. At the same time, the cover plate 500 generally covers the hole region NAA1. The first light shielding layer 3001 may extend into the hole region NAA1. Accordingly, the portion of the cover plate 500 in the hole region NAA1 corresponding to the first light shielding layer 3001 is also the first thinned portion 6001, thereby increasing the light shielding area of the first light shielding layer 3001 and avoiding light leakage. It is to be noted that the first light shielding layer 3001 only covers a portion of the hole region NAA1 to avoid shielding the optical information collection unit from normally collecting the optical information.

The cover plate 500 may be thinned via grinding, etching or the like. After the first thinned portion is prepared, the first light shielding layer 3001 is disposed in contact with the first thinned portion. Then the cover plate 500 is attached to the functional layer or the display panel. The first thinned portion may be formed on one side of the cover plate 500 facing the display panel or the functional layer via a thinning process. Thus, the first light shielding layer 3001 is located between the cover plate and the display panel or the functional layer, and the first light shielding layer 3001 can also be protected by the cover plate 500. In some other implementations, the first thinned portion may also be formed on one side of the cover plate 500 facing away from the display panel or the functional layer via a thinning process. In this case, the first light shielding layer 3001 may be disposed after the cover plate 500 is attached to the display panel or the functional layer.

Figure 5:
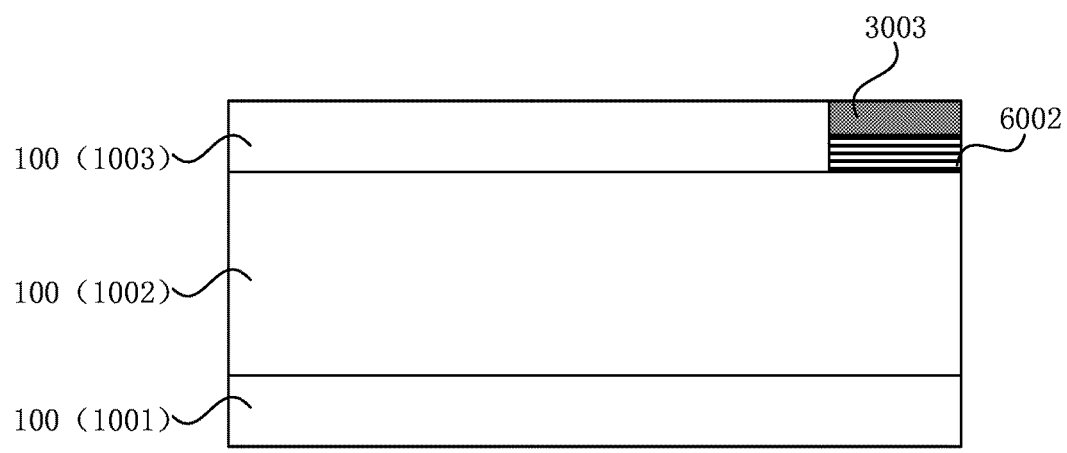
FIG. 5 is a diagram illustrating the structure of a display panel according to an embodiment of the present disclosure.

FIG. 5 is a diagram illustrating the structure of a display panel according to an embodiment of the present disclosure. Referring to FIG. 5, the display panel 100 includes a drive circuit layer 1001, a light-emitting functional layer 1002 and an encapsulation layer 1003 which are stacked in sequence. The encapsulation layer 1003 is provided with a second thinned portion located in the non-display region. The display module further includes a second light shielding layer 3003 disposed in contact with the second thinned portion.

The display panel 100 may be an organic light-emitting diode (OLED) display panel, a liquid crystal display (LCD) panel, an electroluminescence display panel or the like. The display panel 100 is an OLED display panel as an example for description. The drive circuit layer 1001 may include a plurality of pixel drive circuits. For example, the pixel circuit may be a pixel circuit composed of two transistors and one storage capacitor, which is commonly referred to as a 2T1C pixel circuit in the art; or the pixel circuit may be a pixel circuit composed of seven transistors and one storage capacitor and having a threshold compensation function of a drive transistor, which is commonly referred to as a 7T1C pixel circuit in the art. The drive circuit layer 1001 may include a substrate, an active layer, a gate insulating layer, a gate layer, an interlayer insulating layer, a source and drain layer, a planarization layer and the like which are stacked in sequence. Of course, the drive circuit layer may be other structures as long as a corresponding drive current can be supplied to the light-emitting functional layer. The light-emitting functional layer 1002 may include a hole injection layer, a hole transport layer, an electron blocking layer, a light-emitting layer, a hole blocking layer, an electron transport layer and an electron injection layer which are stacked in sequence, and the light-emitting functional layer 1001 may be other structures. The encapsulation layer 1003 may be in a form of, for example, thin film encapsulation, frit encapsulation, conventional encapsulation or the like. The thinned portion may be disposed on the encapsulation layer 1003 of the display panel 100 without the need to provide the thinned portion on the drive circuit layer 1001 or the light-emitting function layer 1002, thereby preventing a case where the light-emitting efficiency is reduced due to the destruction of the structure of the drive circuit layer 1001 or the light-emitting function layer 1002 during the thinning process.

As shown in FIG. 1, the display module may include the support layer 2001, the display panel 100, a first optical adhesive layer 2002, a touch layer 2003, a polarizing layer 2004, a second optical adhesive layer 2005 and the cover plate 500 which are stacked in sequence. The functional layer 200 may include at least one of the support layer 2001, the touch layer 2003, the optical adhesive layer or the polarizing layer 2004. The optical adhesive layer may include at least one of the first optical adhesive layer 2002 or the second optical adhesive layer 2005. The support layer can support the display panel 100. For example, when the display panel 100 is a flexible display panel, the display panel 100 can be supported through the support layer 2001. The material of the support layer 2001 may be, for example, thermoplastic polyethylene terephthalate (PET). The support layer 2001 is generally located on one side of the display panel 100 facing away from the light-emitting surface of the display module. However, since the support layer 2001 is a transparent material, the light emitted from the display panel 100 may directly enter, via the support layer 2001, the optical information collection unit disposed in the hole region NAA1, thereby greatly interfering with the optical information collection unit. The third thinned portion 6003 may be disposed in the portion of in the support layer 2001 located in the non-display region NAA2, and the third light shielding layer 3002 is disposed corresponding to the third thinned portion 6003, so as to reduce the amount of light (which is emitted from the display panel 100) directly entering the optical information collection unit. The third thinned portion 6003 may be formed by thinning one side of the support layer 2001 facing the display panel through a thinning process or may be formed by thinning one side of the support layer 2001 away from the display panel via a thinning process.

The first optical adhesive layer 2002 may be used to fix the display panel 100 to the touch layer 2003. Before the first optical adhesive layer 2002 is cured, the fourth light shielding layer 3004 may be disposed on the surface of optical adhesive. Then the display panel 100 and the touch layer 2003 are pressed together and the optical adhesive is cured, thereby forming the first optical adhesive layer 2002. In this case, the first optical adhesive layer 2002 formed includes the fourth thinned portion 6004 located in the non-display region NAA2. After pressed, the fourth light shielding layer 3004 may be in contact with either the display panel or the touch layer.

The touch mode of the touch layer 2003 is self-capacitive or mutual-capacitive. The fifth thinned portion 6005 may be provided in a portion of the touch layer 20003 in the non-display region NAA2, and the fifth light shielding layer 3005 may be correspondingly provided. The fifth thinned portion 6005 may be formed by thinning one side of the touch layer 2003 facing the display panel 100 via a thinning process or may be formed by thinning one side of the touch layer 2003 facing away from the display panel 100 via a thinning process.

In some other implementations, the sixth thinned portion 6006 may be provided at a portion of the polarizing layer 2004 located in the non-display region NAA2, and the sixth light shielding layer 3006 may be correspondingly provided. The sixth thinned portion 6006 may be formed by thinning one side of the polarizing layer 2004 facing the display panel 100 via a thinning process or may be formed by thinning one side of the polarizing layer 2004 facing away from the display panel 100 by a thinning process.

Optionally, the light shielding layer is flush with the boundary of the hole region.

In this manner, the side surface of the light shielding layer serves as a portion of the inner wall of the through hole. The light leakage of the display module in the hole region mainly results from light entering the hole region from the inner wall of the through hole. The light shielding layer can block most of the light entering the hole region from the inner wall of the through hole, thereby avoiding the light leakage of the display module in the hole region.

Optionally, as shown in FIG. 1, in a plane parallel to the display surface of the display module, the width of the thinned portion is less than the width of the non-display region in a direction Y in which the display region AA points to the center of the hole region NAA1. Optional, the width w2 of the thinned portion is 65% to 80% of the width w1 of the non-display region NAA2.

If the width w2 of the thinned portion is too small relative to the width of the non-display region NAA2, light leakage cannot be effectively avoided. If the width of the thinned portion is too large relative to the width of the non-display region NAA2, although light leakage can be effectively avoided, when the thinned portion is prepared (for example, the thinned portion is formed by a thinning process), the portion of the display panel or the functional layer located in the display region may be affected so that the display panel or the functional layer is damaged and the display effect is affected. Thus, the width of the thinned portion is provided to be 65% to 80% of the width of the non-display region NAA2 so that light leakage can be effectively avoided without affecting the display effect.

Optionally, the thickness of the light shielding layer is correspondingly less than the thickness of the portion of the display panel or the thickness of the portion of the functional layer in the thickness direction of the display module. Optionally, the thickness of the light shielding layer is correspondingly less than 5% of the thickness of the portion of the display panel or the thickness of the portion of the functional layer located in the display region.

If the thickness of the light shielding layer is too thick, the performance of the display panel or the functional layer may be greatly affected. For example, the display panel may be poorly attached to the touch layer, or the display panel or the functional layer may be subjected to a large stress during the thinning process, resulting in cracks in the display panel or the functional layer located in the display region, thereby seriously affecting the performance of the display module. Thus, the thickness of the light shielding layer is provided to be less than 5% of the thickness of the display panel or the thickness of the portion of the corresponding functional layer located in the display region so that light leakage can be effectively avoided, and a large influence on the display panel or functional layer can be prevented.

Optionally, the material of the light shielding layer is at least one of black polyimide, black thermoplastic polyethylene terephthalate, black photoresist or ink.

For example, the light shielding layer may be attached to the corresponding non-display region through etching, inkjet or the like, and the excess portion of the light shielding layer may be removed through laser or the like. The black polyimide, the black thermoplastic polyethylene terephthalate, the black photoresist, the ink or the like has good light shielding effect and low cost, thereby facilitate to reducing the overall cost of the display module.

Figure 6:
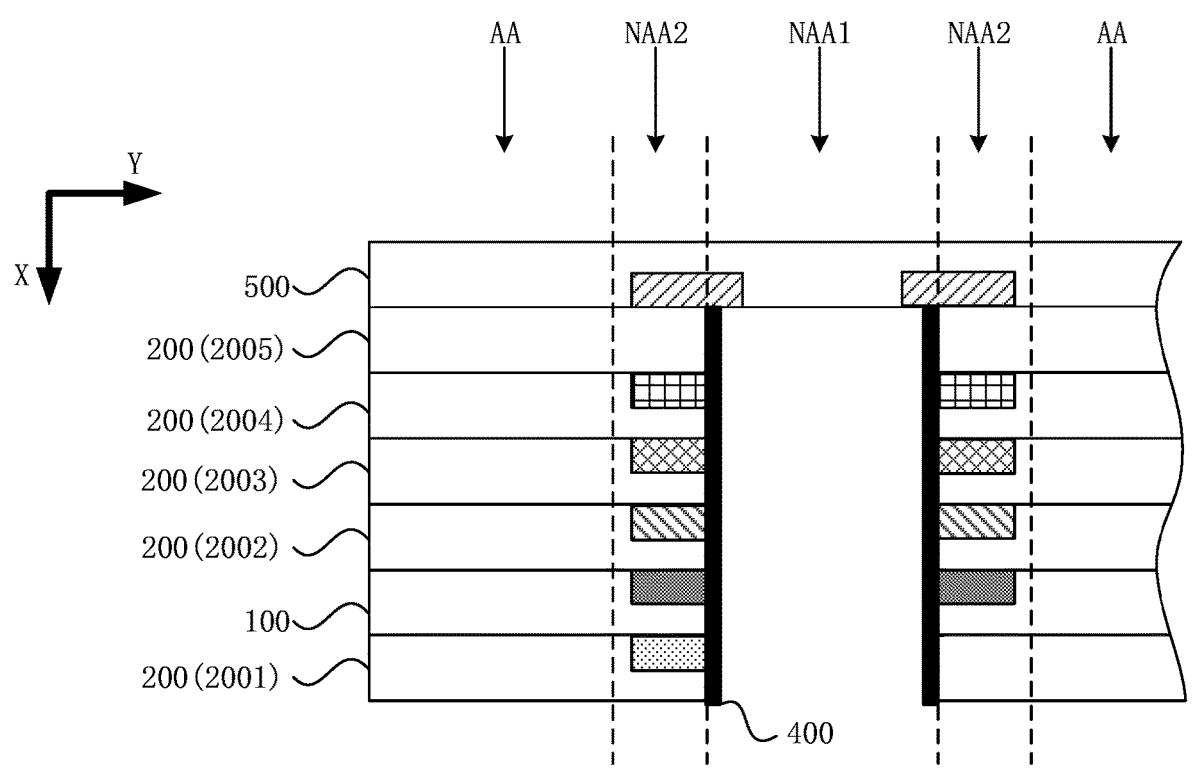
FIG. 6 is a diagram illustrating the structure of another display module according to an embodiment of the present disclosure.

Optionally, FIG. 6 is a diagram illustrating the structure of another display module according to an embodiment of the present disclosure. Referring to FIG. 6, a light shielding film 400 is disposed on the inner wall of the through hole in the hole region NAA1. The light shielding film 400 may be, for example, black silicone adhesive and may be formed on the inner wall of the hole region NAA1 through coating or the like. The light emitted from the display panel 100 does not diverge through the hole region or directly enter the optical information collection unit in the hole region, thereby reducing the risk of light leakage and improving the quality of the optical information collection.

Figure 7:
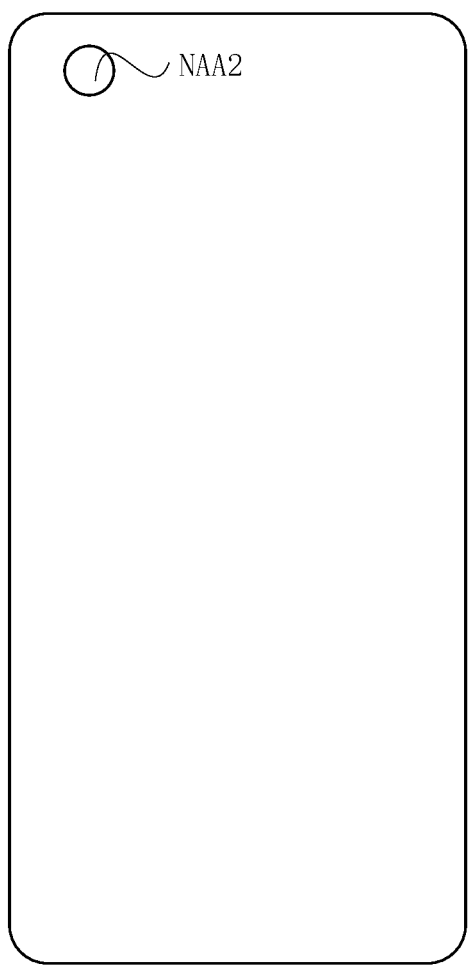
FIG. 7 is a diagram illustrating the structure of a display device according to an embodiment of the present disclosure.

FIG. 7 is a diagram illustrating the structure of a display device according to an embodiment of the present disclosure. Referring to FIG. 7, the display device may be, for example, a personal electronic device such as a mobile phone, a tablet or a laptop, or may be a display device applied to a self-service vending machine or a bank automatic terminal that needs to perform face recognition. The display module provided by any embodiment of the present disclosure is included, and will not be discussed further here.

The hole region NAA1 corresponds to a camera area, that is, a camera module is disposed below the hole region NAA1.

Exemplarily, the optical information collection unit may be a camera. In this case, the hole region may correspond to the camera area. With the light shielding solution of this embodiment, the image quality of the camera is high. In some other implementations, the optical information collection unit may also be an infrared sensor. In this case, the hole region NAA1 may correspond to the infrared sensor area, and the accuracy of the infrared sensor is high.

What is claimed is:

1. A display module, comprising a functional layer and a display panel, wherein the display module is provided with a hole region, a display region and a non-display region between the hole region and the display region, and a through hole is disposed in the hole region;
the display module comprises a light shielding layer and a non-display portion which are located in the non-display region; and
in a thickness direction of the display module, a sum of a thickness of the non-display portion and a thickness of the light shielding layer is the same as a sum of a thickness of a portion of the functional layer in the display region and a thickness of a portion of the display panel in the display region;
wherein the non-display portion comprises a thinned portion contacting with the light shielding layer, wherein the thinned portion is disposed in at least one of a portion of the functional layer located in the non-display region or a portion of the display panel located in the non-display region, wherein in the thickness direction of the display module, a sum (d3) of a thickness of the thinned portion and the thickness of the light shielding layer is correspondingly the same as the thickness of the functional layer in the display region or the thickness of the display panel in the display region, and wherein the thickness of the thinned portion is greater than zero.

2. The display module according to claim 1, further comprising a cover plate and a first light shielding layer, wherein the cover plate is located on a light-emitting side of the display module; and the cover plate comprises a first thinned portion located in the non-display region and contacting with the first light shielding layer, and the first light shielding layer extends from the non-display region to the hole region and covers a portion of the hole region.

3. The display module according to claim 1, further comprising a second light shielding layer, wherein the display panel comprises a drive circuit layer, a light-emitting functional layer and an encapsulation layer which are stacked in sequence, the encapsulation layer is provided with a second thinned portion located in the non-display region and contacting with the second light shielding layer.

4. The display module according to claim 1, wherein the functional layer comprises at least one of a support layer, an optical adhesive layer, a touch layer or a polarizing layer.

5. The display module according to claim 1, wherein the light shielding layer is flush with a boundary of the hole region.

6. The display module according to claim 5, wherein the display module has at least one of the following characteristics:
in a plane parallel to the display surface of the display module, in a direction in which the display region points to a center of the hole region, a width of the thinned portion is less than a width of the non-display region; or in the thickness direction of the display module, the thickness of the light shielding layer is correspondingly less than a thickness of the display panel or a thickness of the functional layer.

7. The display module according to claim 6, wherein the display module has at least one of the following characteristics:
the width of the thinned portion is 65% to 80% of the width of the non-display region; or
the thickness of the light shielding layer is correspondingly less than 5% of the thickness of the display panel located in the display region or the thickness of the functional layer located in the display region.

8. The display module according to claim 1, wherein the material of the light shielding layer is at least one of black polyimide, black thermoplastic polyethylene terephthalate, black photoresist or ink.

9. The display module according to claim 1, wherein a light shielding film is disposed on an inner wall of the through hole in the hole region.

10. The display module according to claim 1, wherein the light shielding layer and the non-display portion are disposed in at least one of a portion of the display module corresponding to the functional layer and located in the non-display region or a portion of the display module corresponding to the display panel and located in the non-display region.

11. The display module according to claim 1, wherein the light shielding layer is formed by doping the portion of the functional layer located in the non-display region with light shielding particles.

12. The display module according to claim 2, wherein the cover plate comprises a glass cover plate.

13. The display module according to claim 2, wherein in the thickness direction of the display module, a sum of a thickness of the first thinned portion and a thickness of the first light shielding layer (3001) is the same as a thickness of a portion of the cover plate in the display region.

14. The display module according to claim 2, wherein the first thinned portion is disposed on one side of the cover plate facing the display panel or the functional layer, and the first thinned portion is formed by a thinning process.

15. The display module according to claim 2, wherein the first thinned portion is disposed on one side of the cover plate facing away from the display panel or the functional layer, and the first thinned portion is formed by a thinning process.

16. The display module according to claim 4, wherein a material of the support layer comprises thermoplastic polyethylene terephthalate (PET).

17. The display module according to claim 4, wherein a touch mode of the touch layer is self-capacitive or mutual-capacitive.

18. The display module according to claim 9, wherein a material of the light shielding film comprises black silicone adhesive.

19. A display device, comprising the display module according to claim 1, wherein a camera module is disposed below the hole region.

20. A display device, comprising the display module according to claim 1, wherein an infrared sensor is disposed below the hole region.

* * * * *